US010097198B1

(12) United States Patent
Lee et al.

(10) Patent No.: US 10,097,198 B1
(45) Date of Patent: Oct. 9, 2018

(54) SAR ADC

(71) Applicants: SK hynix Inc., Gyeonggi-do (KR); SOGANG UNIVERSITY RESEARCH FOUNDATION, Seoul (KR)

(72) Inventors: Seung Hoon Lee, Seoul (KR); Hee Wook Shin, Seoul (KR); Eun Chang Lee, Gyeonggi-do (KR)

(73) Assignees: SK Hynix Inc., Gyeonggi-do (KR); SOGANG UNIVERSITY RESEARCH FOUNDATION, Seoul (KR)

( * ) Notice: Subject to any disclaimer, the term of this patent is extended or adjusted under 35 U.S.C. 154(b) by 0 days.

(21) Appl. No.: 15/814,595

(22) Filed: Nov. 16, 2017

(30) Foreign Application Priority Data

May 2, 2017 (KR) .................. 10-2017-0056498

(51) Int. Cl.
*H03M 1/12* (2006.01)
*H03M 1/46* (2006.01)
*H03M 1/68* (2006.01)
*H03M 1/80* (2006.01)

(52) U.S. Cl.
CPC ......... *H03M 1/466* (2013.01); *H03M 1/1245* (2013.01); *H03M 1/462* (2013.01); *H03M 1/68* (2013.01); *H03M 1/802* (2013.01)

(58) Field of Classification Search
CPC ........ H03M 1/462; H03M 1/08; H03M 1/442; H03M 1/1009; H03M 1/1245; H03M 1/68; H03M 1/802

USPC .......................................... 341/161–163, 172
See application file for complete search history.

(56) References Cited

U.S. PATENT DOCUMENTS

| 6,144,331 | A  | * | 11/2000 | Jiang ................... | H03M 1/0682 341/150 |
| 7,286,075 | B2 | * | 10/2007 | Hennessy ........... | H03M 1/0639 341/144 |
| 8,059,022 | B2 | * | 11/2011 | Cho .................... | H03M 1/0682 341/144 |
| 8,519,874 | B2 | * | 8/2013  | Aruga ................. | H03M 1/1019 341/120 |
| 9,608,656 | B2 | * | 3/2017  | Yuan ................... | H03M 1/1245 |

FOREIGN PATENT DOCUMENTS

KR  101435980  9/2014

OTHER PUBLICATIONS

Shin, H. W. et al., A 0.16mm$^2$ 12b 30MS/s 0.18um CMOS SAR ADC Based on Low-Power Composite Switching, Journal of the Institute of Electronics and Information Engineers, Jul. 2016, pp. 1027-1038. vol. 53, No. 7.
Shin, H. W., A 0.055mm$^2$ 12b 30MS/s 90nm CMOS SAR ADC Employing Low-Power Composite Switching, Dec. 2016, Sogang University.

* cited by examiner

*Primary Examiner* — Khai M Nguyen
(74) *Attorney, Agent, or Firm* — IP & T Group LLP

(57) ABSTRACT

Disclosed is a successive-approximation register (SAR) analog-to-digital converter (ADC). The SAR ADC may include a capacitor-resistor hybrid digital-to-analog converter (DAC), and apply a low-power switching method and an input signal range scaling method to the DAC, thereby significantly reducing surface area and power consumption.

17 Claims, 10 Drawing Sheets

SAR ADC

CROSS-REFERENCE TO RELATED APPLICATIONS

The present application claims priority to Korean Patent Application No. 10-2017-0056498, filed on May 2, 2017, which is herein incorporated by reference in its entirety.

BACKGROUND

1. Field

Various embodiments relate to an analog-to-digital converter (ADC). Particularly, various embodiments relate to a successive-approximation register (SAR) ADC.

2. Description of the Related Art

Recently, with the growing demand for portable medical devices, wireless sensor networks and image sensors which consume low power consumption, a system-on-chip (SoC) is becoming more important, in which circuits for implementing various systems are integrated as one chip. In particular, a sensor SoC requires an ADC for converting an analog signal into a digital signal. Since a plurality of circuits must be integrated in one chip, the SoC requires an ADC with a small area and excellent power efficiency.

Therefore, research is being actively conducted on a successive-approximation register (SAR) ADC based on a digital logic circuit, which has a smaller area and lower power consumption than pipeline, delta-sigma and algorithmic structure ADCs, and which is compatible with the development of nano-processing technology such as 65 nm and 45 nm processes.

Recently, various switching methods for reducing switching power consumption of a digital-to-analog converter (DAC) which is a main power consumer of the SAR ADC have been suggested in order to implement a SAR ADC having low power consumption. In general, a monotonic switching method and a common mode voltage-based switching method are primarily used.

However, the conventional monotonic switching method has a problem in that a dynamic offset is caused by a common mode voltage variation of a DAC output during a SAR operation, and the conventional common mode voltage-based switching method has a disadvantage in that it requires a larger number of switches than the monotonic switching method and additionally requires a relatively complex digital logic circuit to drive the switches.

Furthermore, since a number of unit capacitors used in the DAC exponentially increases as resolution in the SAR ADC becomes greater, area and power consumption of the SAR ADC also increase. In order to overcome such a disadvantage, unit capacitors with a small capacity may be used. However, since the capacity reduction may cause a parasitic capacitance and mismatch between the capacitors, a detailed layout is required.

SUMMARY

Various embodiments are directed to a low-power composite switching based SAR ADC having minimized area and low power consumption.

In an embodiment, a SAR ADC may include a DAC, wherein the DAC may include: a first capacitor array including a plurality of first capacitors; a second capacitor array including a plurality of second capacitors; and a resistor string suitable for generating differential reference voltages. The SAR ADC may determine a digital code of high-order bits by selectively applying first and second reference voltages and an input signal to the first capacitors, and determine a digital code of low-order bits by selectively applying the differential reference voltages and a common mode voltage to the second capacitors.

In an embodiment, a SAR ADC may include: a DAC including a first capacitor array including a plurality of first capacitors, a second capacitor array including a plurality of second capacitors, and a resistor string suitable for providing differential reference voltages; a comparator suitable for comparing output signals of the DAC; and a SAR logic circuit suitable for converting an input signal into a digital code using the comparison result. The SAR logic circuit may determine a digital code of high-order bits by selectively applying first and second reference voltages and an input signal to the first capacitors, and determine a digital code of low-order bits by selectively applying the differential reference voltages and a common mode voltage to the second capacitors.

In an embodiment, a SAR ADC may include a DAC, wherein the DAC may include: a first capacitor array including first capacitors of which the capacities have a ratio of powers of 2; a second capacitor array including a plurality of second capacitors each of which is an unit capacitor; and a resistor string suitable for generating differential reference voltages including levels which have a ratio of powers of 2, in the range of first and second reference voltages. The first capacitors and a part of the second capacitors may be configured to sample the input signal.

DETAILED DESCRIPTION

Figure 1:
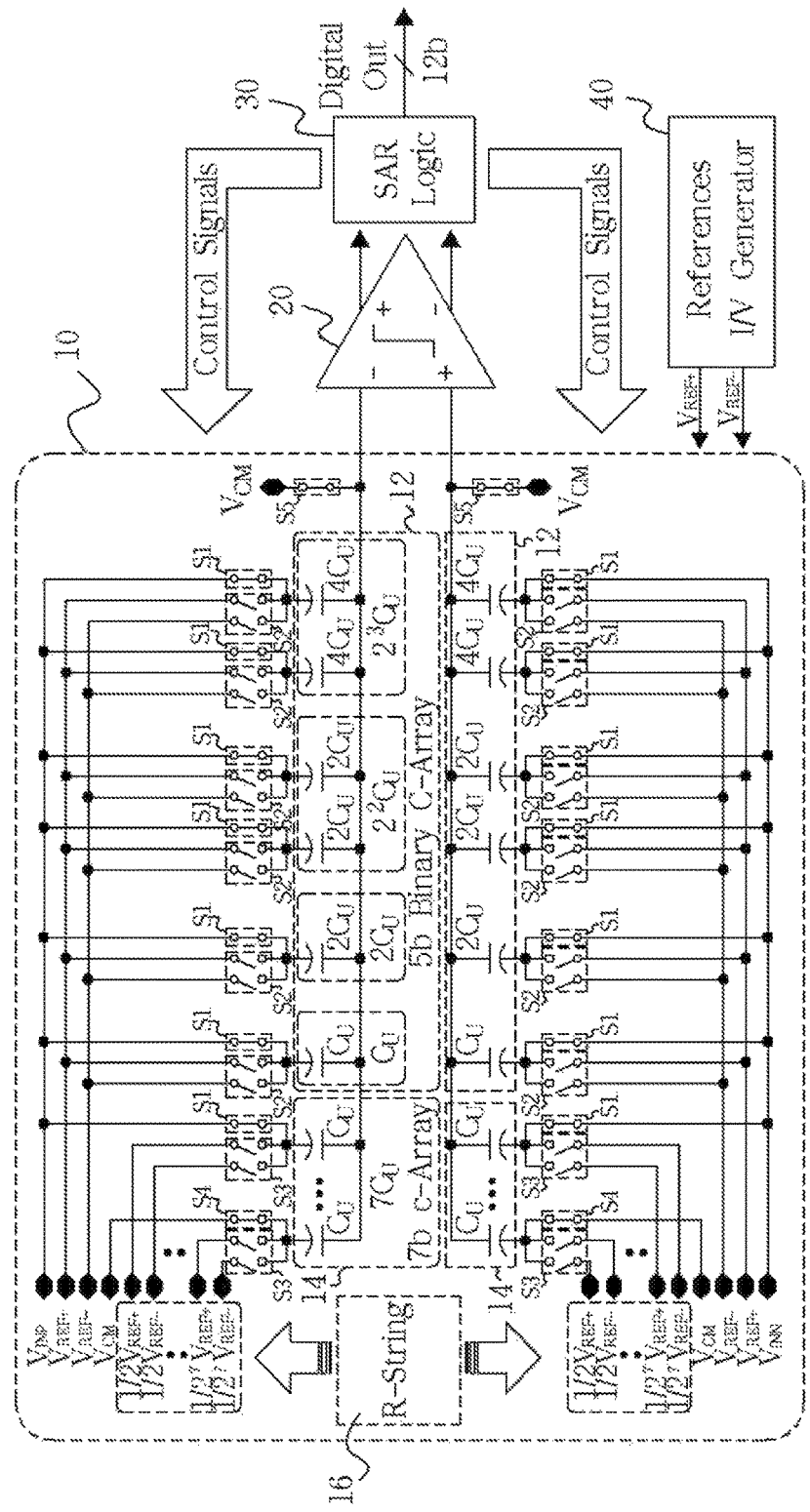
FIG. 1 illustrates a SAR ADC according to an embodiment of the present invention.

Hereafter, various embodiments will be described below in more detail with reference to the accompanying drawings, such that the present invention can be easily embodied by those skilled in the art to which the invention pertains. Throughout the disclosure, like reference numerals refer to like parts throughout the various figures and embodiments of the present invention.

Moreover, detailed descriptions related to well-known functions or configurations will be ruled out in order not to unnecessarily obscure subject matters of the present invention.

The terms such as first and second may be used to describe various elements, but the elements are not limited by the terms, and the terms are used only to distinguish one element from another element.

A successive-approximation register (SAR) analog-to-digital converter (ADC) employs a low-power composite switching method in which a monotonic switching method and a common mode voltage-based switching method are combined with each other.

FIG. 1 illustrates a SAR ADC according to an embodiment of the present invention.

Referring to FIG. 1, the SAR ADC includes a digital-to-analog converter (DAC) 10, a comparator 20, a SAR logic circuit 30 and a reference current and reference voltage generator 40.

The DAC 10 includes first and second capacitor arrays 12 and 14 and a resistor string 16. The first capacitor array 12 is used for determining a digital code of high-order bits, and the second capacitor array 14 is used for determining a digital code of low-order bits. The first and second capacitor arrays 12 and 14 form a differential structure, and provide output signals to the comparator 20. The first capacitor array 12 includes capacitors $C_U$, $2C_U$, $2^2C_U$ and $2^3C_U$ of which the capacities have a ratio of powers of 2, and the second capacitor array 14 includes unit capacitors $C_U$.

The resistor string 16 generates differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$, which have a ratio of negative powers of 2, in the range of first and second reference voltages $V_{REF+}$ and $V_{REF-}$, and provides the differential reference voltages to the unit capacitors $C_U$ of the second capacitor array 14.

The first capacitor array 12 selectively receives the first and second reference voltages $V_{REF+}$ and $V_{REF-}$ and is used for determining a digital code of high-order bits, and the second capacitor array 14 selectively receives the differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ and is used for determining a digital code of low-order bits.

For example, the first and second capacitor arrays 12 and 14 may be used for determining a digital code of five high-order bits and a digital code of seven low-order bits, respectively. All the capacitors $C_U$, $2C_U$, $2^2C_U$ and $2^3C_U$ of the first capacitor array 12 and the unit capacitor $C_U$ corresponding to the most significant bit among the seven low-order bits in the second capacitor array 14 may be used for sampling input signals $V_{INP}$ and $V_{INN}$.

The first capacitor array 12 includes equally divided capacitor sets $2^2C_U$ and $2^3C_U$ each including equally divided capacitors having the same capacity. The equally divided capacitor sets $2^2C_U$ and $2^3C_U$ selectively receive first and second reference voltages $V_{REF+}$ and $V_{REF-}$, and are used for determining a digital code of the most significant bits.

For example, the equally divided capacitor set $2^3C_U$ includes first and second equally divided capacitors $4C_U$ and $4C_U$ having the same capacity, and the equally divided capacitor set $2^2C_U$ includes third and fourth equally divided capacitors $2C_U$ and $2C_U$ having the same capacity. The equally divided capacitor sets $2^2C_U$ and $2^3C_U$ may be used for determining a digital code of the two most significant bits.

The DAC 10 includes selection switches S2 and S3 that selectively transmit the first and second reference voltages $V_{REF+}$ and $V_{REF-}$ and the differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ to the first and second capacitor arrays 12 and 14. Furthermore, the DAC 10 includes bootstrapping switches S1 that transmit the input signals $V_{INP}$ and $V_{INN}$ to the capacitors $C_U$, $2C_U$, $2^2C_U$ and $2^3C_U$ of the first capacitor array 12 and the unit capacitor $C_U$ corresponding to the most significant bit among the unit capacitors in the second capacitor array 14, in order to sample the input signals $V_{INP}$ and $V_{INN}$. At this time, the first and second reference voltages $V_{REF+}$ and $V_{REF-}$, the differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ and the input signals $V_{INP}$ and $V_{INN}$ are transmitted to the capacitors through the switches.

Furthermore, the DAC 10 includes switches S4 and switches S5. The switches S4 transmit the common mode voltage $V_{CM}$ to the bottom plates of unit capacitors corresponding to the least significant bits among the unit capacitors of the second capacitor array 14, and the switches S5 transmit the common mode voltage $V_{CM}$ to the top plates of all the capacitors of the first and second capacity array 12 and 14. The bottom plate and the top plate indicate electrodes at both ends of the corresponding capacitor.

The comparator 20 compares output signals from the DAC 10 including the first and second capacitor arrays 12 and 14 forming a differential structure, and provides the comparison result to the SAR logic circuit 30.

The SAR logic circuit 30 controls the bootstrapping switches S1 of the DAC 10 to sample the input signals $V_{INP}$ and $V_{INN}$ into the capacitors of the first capacitor array 12 and the unit capacitor corresponding to the most significant bit among the unit capacitors of the second capacitor array 14, and receives the comparison result between the output signals of the DAC 10 from the comparator 20. When the sampled input signals $V_{INP}$ and $V_{INN}$ are converted into digital signals, the SAR logic circuit 30 controls the selection switches S2 to selectively apply the first and second reference voltages $V_{REF+}$ and $V_{REF-}$ to the first capacitor array 12, and controls the selection switches S3 to selectively transmit the differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ to the second capacitor array 14.

When the input signals $V_{INP}$ and $V_{INN}$ are sampled, the SAR logic circuit 30 applies the common mode voltage $V_{CM}$ to the top plates of all the capacitors $C_U$, $2C_U$, $2^2C_U$, $2^3C_U$ and $7C_U$ of the first and second capacitor arrays 12 and 14, applies the input signals $V_{INP}$ and $V_{INN}$ to the bottom plates of the capacitors $C_U$, $2C_U$, $2^2C_U$ and $2^3C_U$ of the first capacitor array 12, applies the common mode voltage $V_{CM}$ to the bottom plates of the unit capacitors corresponding to the least significant bits among the unit capacitors of the second capacitor array 14, and applies the input signals $V_{INP}$ and $V_{INN}$ to the bottom plate of the unit capacitor corresponding to the most significant bit among the unit capacitors of the second capacitor array 14.

The SAR logic circuit 30 selectively applies the first and second reference voltages $V_{REF+}$ and $V_{REF-}$ to the equally divided capacitor set $2^3C_U$, in order to determine the digital code of the most significant bits. First, the SAR logic circuit 30 applies the first and second reference voltages $V_{REF+}$ and $V_{REF-}$ to the bottom plates of the first and second equally divided capacitors $4C_U$ and $4C_U$ of the equally divided capacitor set $2^3C_U$, respectively, before the operation of the comparator 20. This operation has the same effect as when the common mode voltage $V_{CM}$ is applied to the equally divided capacitor set. Then, the SAR logic circuit 30 applies the first or second reference voltage $V_{REF+}$ or $V_{REF-}$ to the bottom plates of the first and second equally divided capacitors $4C_U$ and $4C_U$ according to the comparison result of the comparator 20 after the operation of the comparator 20. This operation has the same effect as when the first or second reference voltage $V_{REF+}$ or $V_{REF-}$ is applied to the equally divided capacitor set $2^3C_U$. The equally divided capacitor set $2^2C_U$ including the third and fourth equally divided capacitors $2C_U$ and $2C_U$ having the same capacity performs a similar operation to the equally divided capacitor set $2^3C_U$.

In order to determine the digital code of high-order bits, the SAR logic circuit 30 selectively applies the first and second reference voltages $V_{REF+}$ and $V_{REF-}$ to the capacitors $C_U$ and $2C_U$ of the first capacitor array 12 according to the comparison result of the comparator 20.

In order to determine the digital code of low-order bits, the SAR logic circuit 30 selectively applies the differential reference voltages $\tfrac{1}{2}V_{REF+}$, $\tfrac{1}{2}V_{REF-}$, $\tfrac{1}{2^2}V_{REF+}$, $\tfrac{1}{2^2}V_{REF-}$, ..., $\tfrac{1}{2^7}V_{REF+}$ and $\tfrac{1}{2^7}V_{REF-}$ to the unit capacitors of the second capacitor array 14 according to the comparison result of the comparator.

The SAR logic circuit 30 may include a latch-type register. This configuration can improve the operation speed and stability of the SAR ADC, and remove a decoder logic circuit required for DAC switching, thereby additionally reducing the area and power consumption of the SAR ADC.

Figure 2:
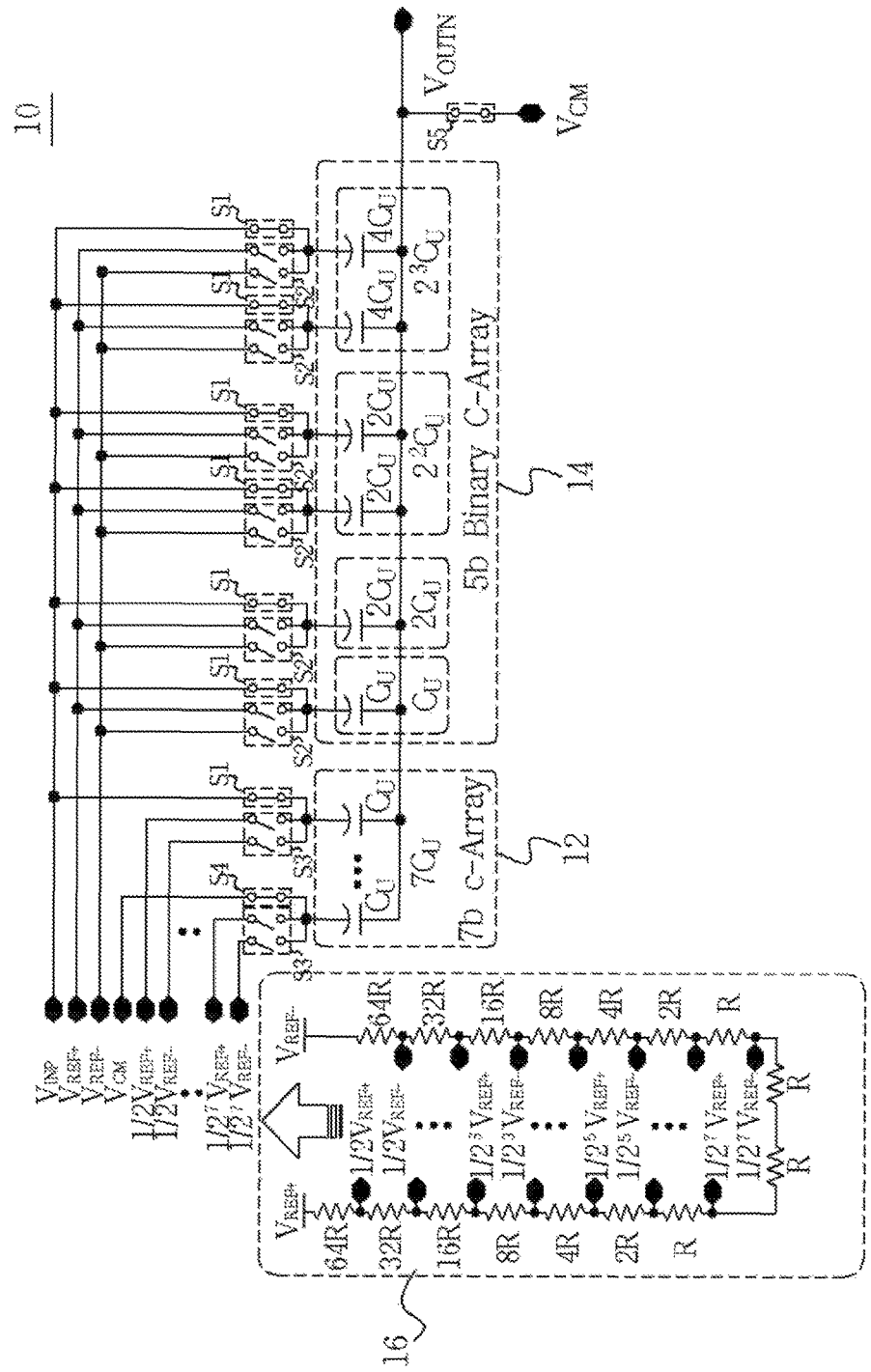
FIG. 2 illustrates a DAC of FIG. 1.

FIG. 2 illustrates the DAC 10 of FIG. 1.

Referring to FIG. 2, the DAC 10 includes the first and second capacitor arrays 12 and 14 and the resistor string 16. The first capacitor array 12 includes the capacitors $C_U$, $2C_U$, $2^2C_U$ and $2^3C_U$ of which the capacities have a ratio of powers of 2, the second capacitor array 14 includes the unit capacitors $C_U$, and the resistor string 16 includes resistors coupled in series between the first and second reference voltages $V_{REF+}$ and $V_{REF-}$ and having resistances values set to a ratio of powers of 2. The resistor string 16 generates the differential reference voltages $\tfrac{1}{2}V_{REF+}$, $\tfrac{1}{2}V_{REF-}$, $\tfrac{1}{2^2}V_{REF+}$, $\tfrac{1}{2^2}V_{REF-}$, ..., $\tfrac{1}{2^7}V_{REF+}$ and $\tfrac{1}{2^7}V_{REF-}$ having a ratio of negative powers of 2 in the range of the first and second reference voltages $V_{REF+}$ and $V_{REF-}$, and provides the generated differential reference voltages to the unit capacitors $C_U$ of the second capacitor array 14.

The DAC 10 further includes the selection switches S2 and S3 and the bootstrapping switches S1. The selection switches S2 and S3 selectively transmit the first and second reference voltages $V_{REF+}$ and $V_{REF-}$ and the differential reference voltages $\tfrac{1}{2}V_{REF+}$, $\tfrac{1}{2}V_{REF-}$, $\tfrac{1}{2^2}V_{REF+}$, $\tfrac{1}{2^2}V_{REF-}$, ..., $\tfrac{1}{2^7}V_{REF+}$ and $\tfrac{1}{2^7}V_{REF-}$ to the first and second capacitor arrays 12 and 14, and the bootstrapping switches S1 transmit the input signals $V_{INP}$ and $V_{INN}$ to the capacitors $C_U$, $2C_U$, $2^2C_U$ and $2^3C_U$ of the first capacitor array 12 and the unit capacitor corresponding to the most significant bit among the unit capacitors $C_U$ of the second capacitor array 14, in order to sample the input signal $V_{INP}$ and $V_{INN}$. The DAC 10 further includes the switches S4 and the switches S5. The switches S4 transmit the common mode voltage $V_{CM}$ to the bottom plates of the unit capacitors corresponding to the least significant bits among the unit capacitors of the second capacitor array 14, and the switches S5 transmit the common mode voltage $V_{CM}$ to the top plates of all the capacitors of the first and second capacitor arrays.

In the present embodiment, the low-power composite switching method is applied to the DAC 10. This configuration can remove a capacitor that occupies the largest area in the DAC 10 and is used for determining the most significant bit. Furthermore, since the resistor string 16 for generating 14 reference voltages and the capacitor-resistor hybrid DAC 10 for determining seven low-order bits through seven unit capacitors $C_U$ are applied, the maximum capacitor size can be reduced to $2^3C_U$ from $2^{10}C_U$. The low-power composite switching method may be a combination of the monotonic switching method and the common mode voltage-based switching method. The low-power composite switching method can reduce a dynamic offset, and simplify a complex digital logical circuit through a simple switching operation.

In the present embodiment, an input signal range scaling method may be applied to match the input signals with the reference voltage range, such that a ratio of the entire capacitor size $22C_U$ of the DAC 10 to the capacitor size for determining each digital code is set to a power of 2.

As such, the total number of unit capacitors $C_U$ used in the DAC 10 can be optimized to a number of 22 based on the single structure or a number of 44 based on the differential structure, which makes it possible to significantly reduce the area of the DAC 10 which occupies the largest area in the SAR ADC with high resolution.

Figure 3:
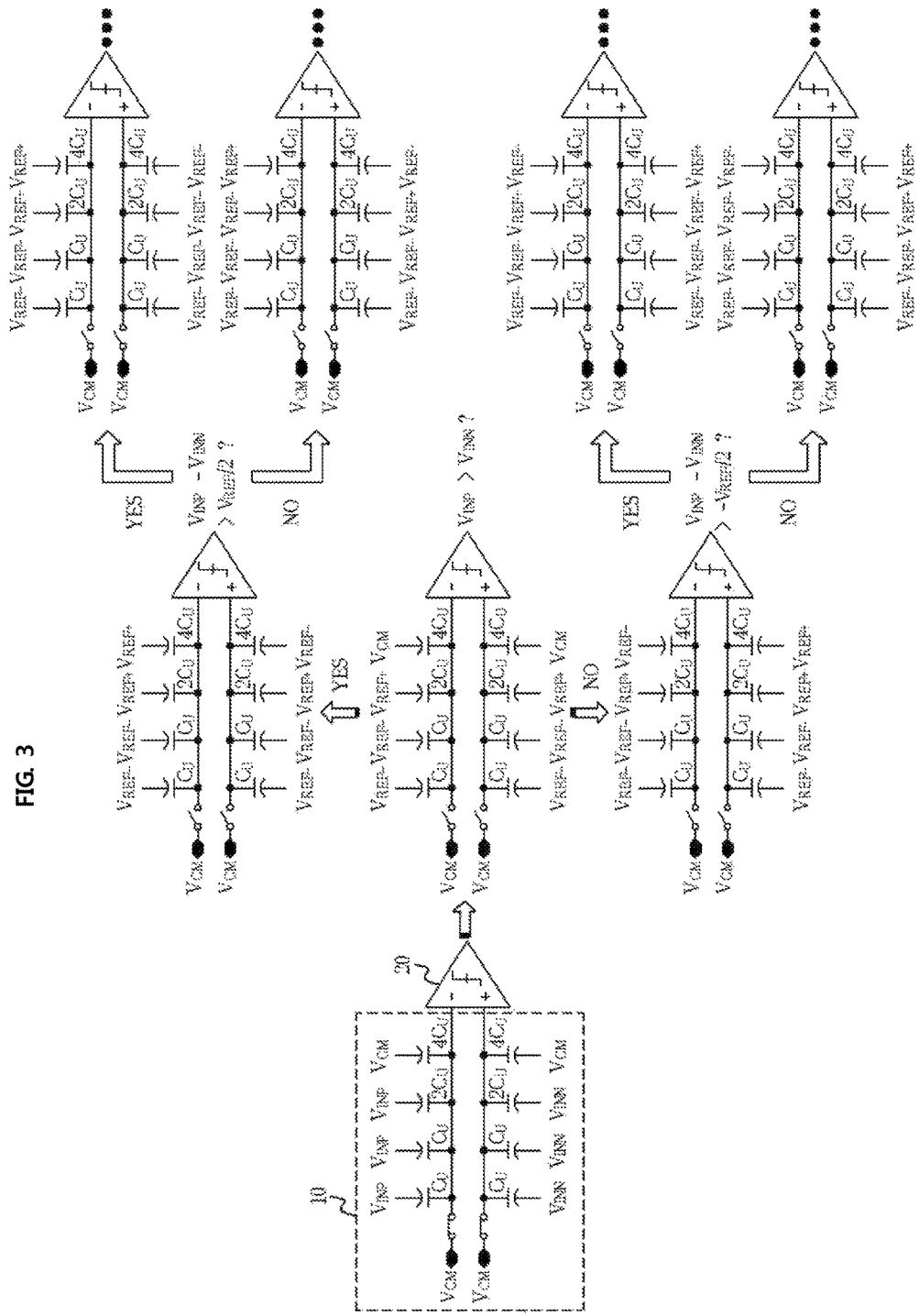
FIG. 3 is a diagram for describing a low-power composite switching method of the SAR ADC of FIG. 1.

FIG. 3 is a diagram for describing the low-power composite switching method of the SAR ADC of FIG. 1. For example, FIG. 3 illustrates a process of determining a 4-bit digital code.

Referring to FIG. 3, a bottom-plate input sampling operation of applying the common mode voltage $V_{CM}$ and the input signals $V_{INP}$ and $V_{INN}$ to the top plates and bottom plates of the respective capacitors is performed in the same manner as the common mode voltage-based switching method.

After the bottom-plate input sampling operation, the switches S5 for applying the common mode voltage $V_{CM}$ to the top plates of the capacitors are turned off to perform a redistribution operation. Depending on the number of the most significant bits, determined through the common mode voltage-based switching method, the bottom plates of the respective capacitors are coupled to the common mode voltage $V_{CM}$ and the first and second reference voltages $V_{REF+}$ and $V_{REF-}$. FIG. 3 exemplifies that only one bit corresponding to the most significant bit among the total of four bits is set to the digital code of the most significant bit through the common mode voltage-based switching method. The largest capacitor $4C_U$ is coupled to the common mode voltage $V_{CM}$, and the other capacitors are coupled to the first and second reference voltages $V_{REF+}$ and $V_{REF-}$.

Then, the comparator 20 determines the most significant bit by comparing the magnitudes of two output voltages of the output terminals of the DAC 10. According to an output result of the comparator 20, the first reference voltage $V_{REF+}$ is applied to one of the bottom plates of the two largest capacitors $4C_U$, and the second reference voltage $V_{REF-}$ is applied to the other bottom plate. In accordance with an embodiment of the present invention, the low-power composite switching method can determine the most significant bit through the common mode voltage-based switching method, and thus remove the largest variation among common mode voltage variations of the DAC output, which may occur during the conversion process. The other three bits may be determined by a switching operation through the monotonic switching method, and a digital code of the bits may be determined through a first down-transition switching operation and a subsequent up-transition switching operation, which makes it possible to minimize the common mode voltage variation of the DAC output.

As a larger number of most significant bits are determined through the common mode voltage-based switching method, the low-power composite switching method can reduce the common mode voltage variation of the DAC output, but the average switching power consumption may be increased. Thus, a trade-off between the common mode voltage variation of the DAC output and the average switching power consumption is required. In accordance with an embodiment of the present invention, the number of most significant bits determined through the common mode voltage-based switching method may be optimized to 2, in order to minimize switching power consumption while satisfying a common mode voltage variation of a DAC output, which is required for the SAR ADC of a 12-bit resolution.

Figure 4:
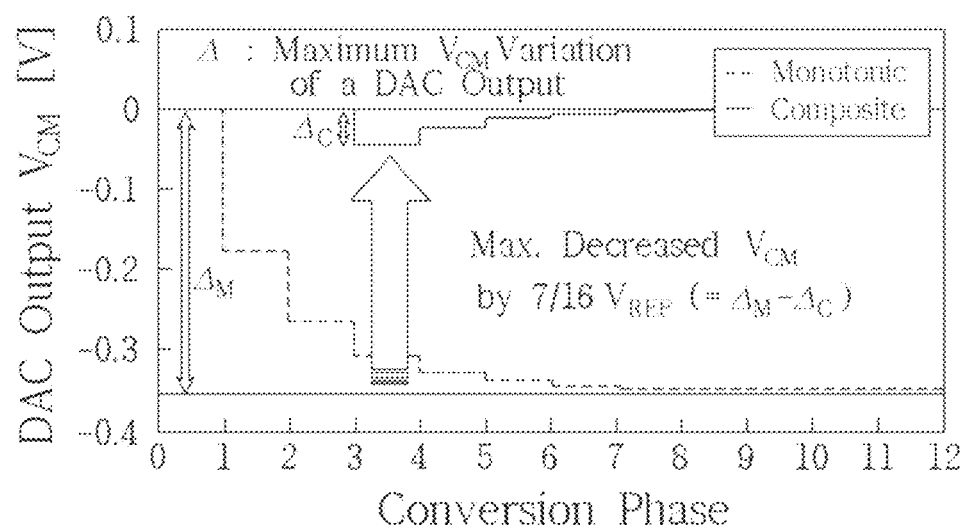
FIG. 4 is a graph comparatively illustrating common mode voltage variations of DAC outputs according to the low-power composite switching method of the SAR ADC of FIG. 1 and a monotonic switching method.

FIG. 4 is a graph comparatively illustrating common mode voltage variations of DAC outputs in the low-power composite switching method of the SAR ADC of FIG. 1 and a general monotonic switching method.

Referring to FIG. 4, the maximum common mode voltage variation of a DAC output in the general monotonic switching method is $\frac{1}{2}V_{REF}$. At this time, $V_{REF}$ indicates a difference between the two reference voltages $V_{REF+}$ and $V_{REF-}$.

The low-power composite switching method can determine the two most significant bits through the common mode voltage-based switching method, and reduce the maximum common mode voltage variation of the DAC output to $\frac{1}{16}V_{REF}$ corresponding to 12.5% of that of the monotonic switching method, thereby minimizing a dynamic offset that limits the linearity of the SAR ADC.

The average switching power consumption of the low-power composite switching method can be acquired through Equation 1 below, and represented by $E_{VAG,composite}$.

$$E_{ave,composite} = \sum_{i=1}^{k}(2^{n-2-2i})(2^i-1)CV_{REF}^2 + \sum_{i=k+1}^{n-2}(2^{n-1-i})CV_{REF}^2 + 2^{n-4-k}\times\left(2-\frac{1}{2^{k-1}}\right)CV_{REF}^2$$ [Equation 1]

The first and second terms of Equation 1 indicate average switching power consumption in the common mode voltage-based switching method and average switching power consumption in the monotonic switching method, and the third term indicates average switching power consumption when the common mode voltage-based switching is changed to the monotonic switching. In Equation 1, n and k represent the entire resolution of the SAR ADC and the number of bits to which the common mode voltage-based switching method is applied, respectively. In the SAR ADC according to the present embodiment, n and k may be set to 12 and 2, and the average switching power consumption of the composite switching, obtained by putting 12 and 2 as n and k in Equation 1, is $671.5CV_{REF}^2$.

Figure 5:
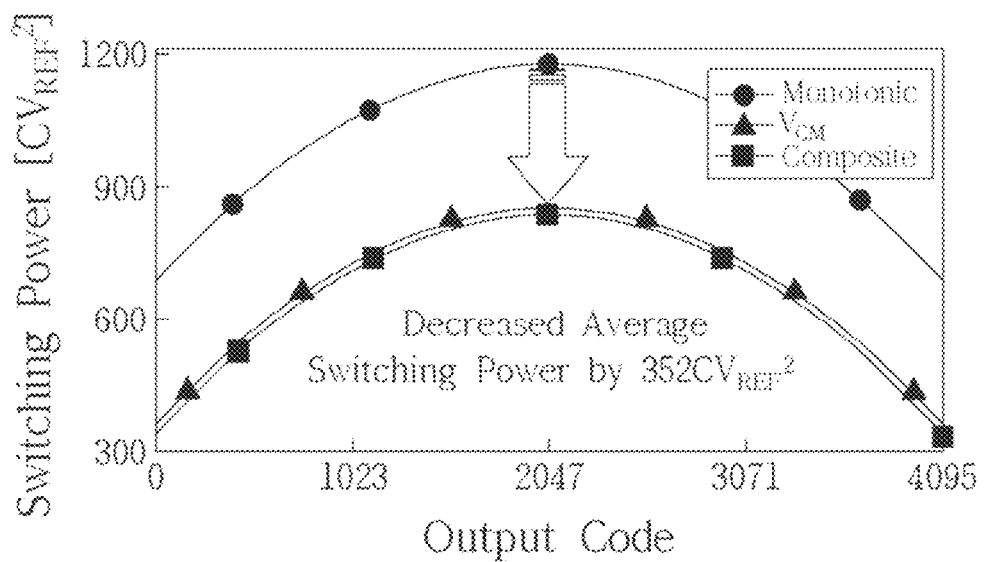
FIG. 5 is a graph comparatively illustrating switching power consumptions for codes in the low-power composite switching method of the SAR ADC of FIG. 1, the monotonic switching method and a common mode voltage-based switching method.

FIG. 5 is a graph comparatively illustrating switching power consumptions for the codes in the low-power composite switching method, the monotonic switching method and the common mode voltage-based switching method.

Referring to FIG. 5, the maximum common mode voltage variation of a DAC output in the low-power composite switching method is smaller by $\frac{7}{16}V_{REF}$ than in the monotonic switching method, and the low-power composite switching method exhibits the lowest average switching power consumption. The low-power composite switching method can adjust the number of most significant bits through the common mode voltage-based switching method, and thus optimize common mode voltage variations of the DAC output within such a range that has no influence on the performance of the SAR ADC. Furthermore, the low-power composite switching method can use only switches corresponding to 75% of the number of switches used in the common mode voltage-based switching method, while simplifying the necessary digital logic circuit, thereby reducing the area of the DAC.

The SAR ADC according to the present embodiment has minimized the total number of unit capacitors to a number of 22 by applying the low-power composite switching method and the capacitor-resistor hybrid DAC. Furthermore, the SAR ADC has employed the input signal range scaling method such that the ratio of the minimized capacitor size $22C_U$ of the DAC to the capacitor size for determining each digital code depending on an input signal is set to a power of 2, and matched the input signal with the reference voltage range.

When a reference voltage range scaling method is applied, the capacitor sizes may be set to a ratio of powers of 2. In this case, however, the area may be increased since the unit capacitors $10C_U$ are additionally needed, and the ratio of the whole capacitors to the capacitors for determining the respective digital codes may be reduced to the half of that in a general DAC. Thus, a reference voltage which is twice higher, may be required.

Figure 6:
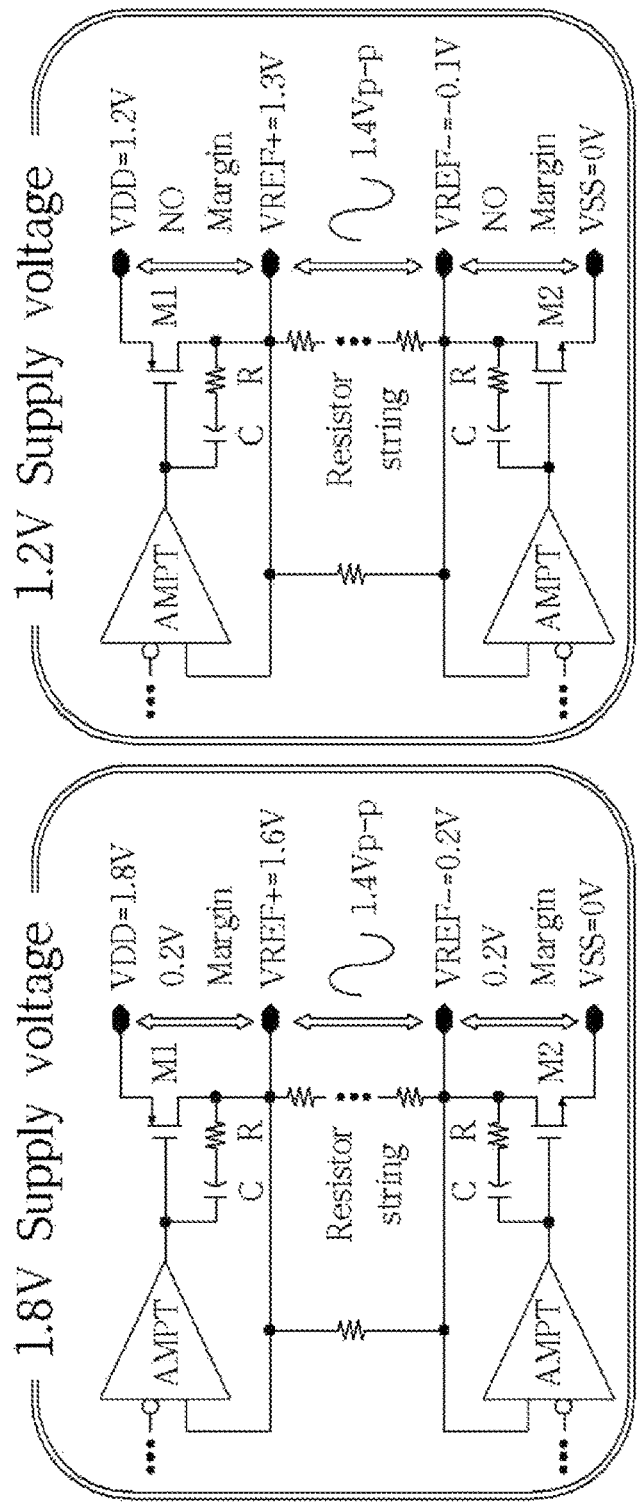
FIG. 6 illustrates an output terminal of a reference current and reference voltage generator when a reference voltage range scaling method is applied under different supply voltage conditions.

FIG. 6 illustrates an output terminal of the reference current and reference voltage generator when the reference voltage range scaling method is applied under different supply voltage conditions.

Referring to FIG. 6, when a supply voltage of 1.8V is used, the first and second reference voltages $V_{REF+}$ and $V_{REF-}$ for an input signal range of $1.4V_{P-P}$ may be set to 1.6V and 0.2V by the reference voltage scaling method. Since two transistors M1 and M2 can be operated in a saturation region with a sufficient margin, the reference current and voltage generator can be designed. However, when the reference voltage range scaling method is applied to an ADC using a relatively low supply voltage of 1.2V, the transistors M1 and M2 cannot be operated in the saturation region, which makes it impossible to design the reference current and reference voltage generator. The magnitude of an input signal may be reduced to design the reference current and reference voltage generator, but the reduction in magnitude of the input signal may limit the performance.

Therefore, the SAR ADC according to the present embodiment may apply the input signal range scaling method to solve the above-described problem without using additional unit capacitors.

Figure 7:
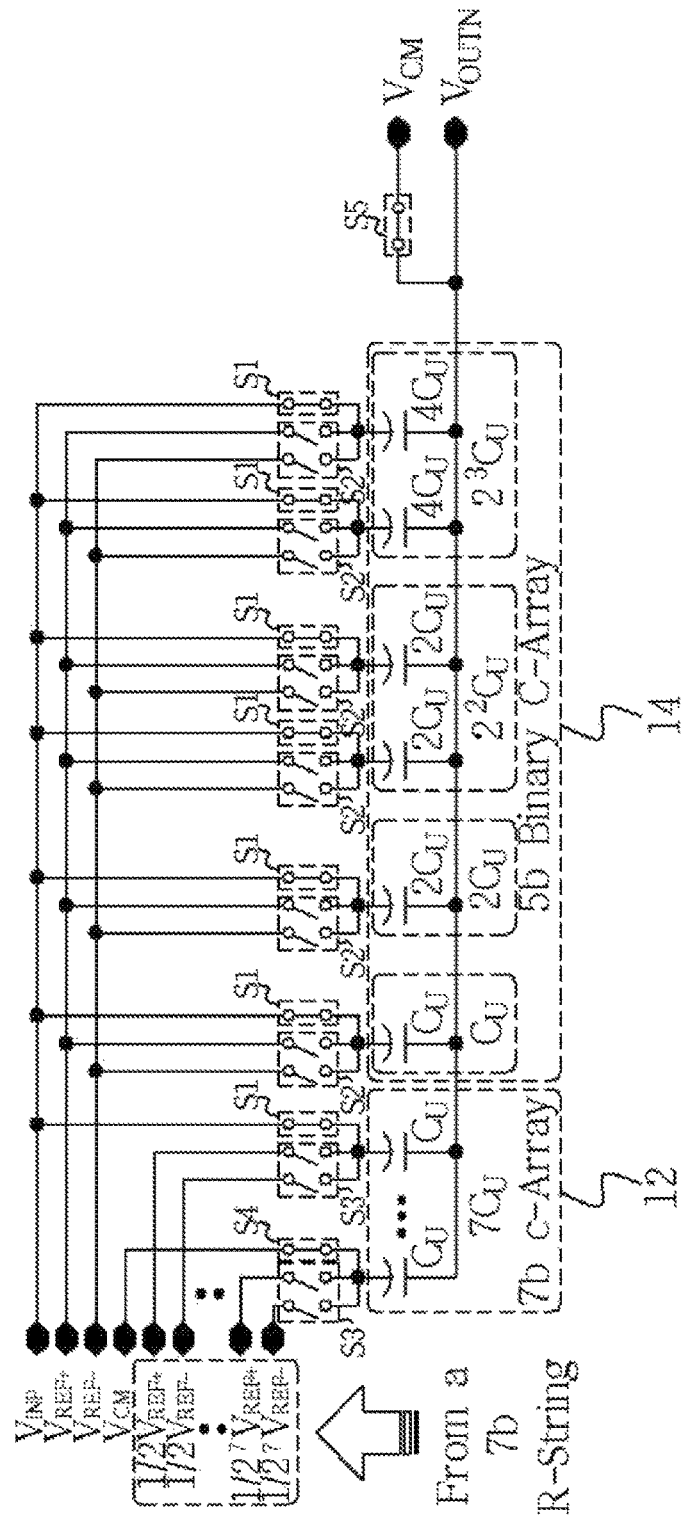
FIG. 7 is a diagram for describing an input signal range scaling method of the SAR ADC of FIG. 1.

FIG. 7 is a diagram for describing the input signal range scaling method of the SAR ADC of FIG. 1.

Referring to FIG. 7, all the capacitors $C_U$, $2C_U$, $2^2C_U$ and $2^3C_U$ of the first capacitor array 12 and the unit capacitor $C_U$ of the second capacitor array 14, corresponding to the most significant bit among the seven low-order bits, in the DAC 10 may be used for sampling the input signal $V_{INP}$. The bootstrapping switches S1 transmit the input signal $V_{INP}$ to the bottom plates of the capacitors $C_U$, $2C_U$, $2^2C_U$ and $2^3C_U$ of the first capacitor array 12 and the unit capacitor $C_U$ corresponding to the most significant bit among the unit capacitors of the second capacitor array 14, in order to sample the input signal $V_{INP}$. As described above, the input signal range scaling method uses only 16 unit capacitors among the 22 unit capacitors as the sampling capacitors, such that an influence on a DAC output voltage by the reference voltages is set to a ratio of powers of 2, when a digital code of all bits is determined. The reference voltage range scaling method can match the input signal with the reference voltage range without using additional unit capacitors $10C_U$.

Figure 8:
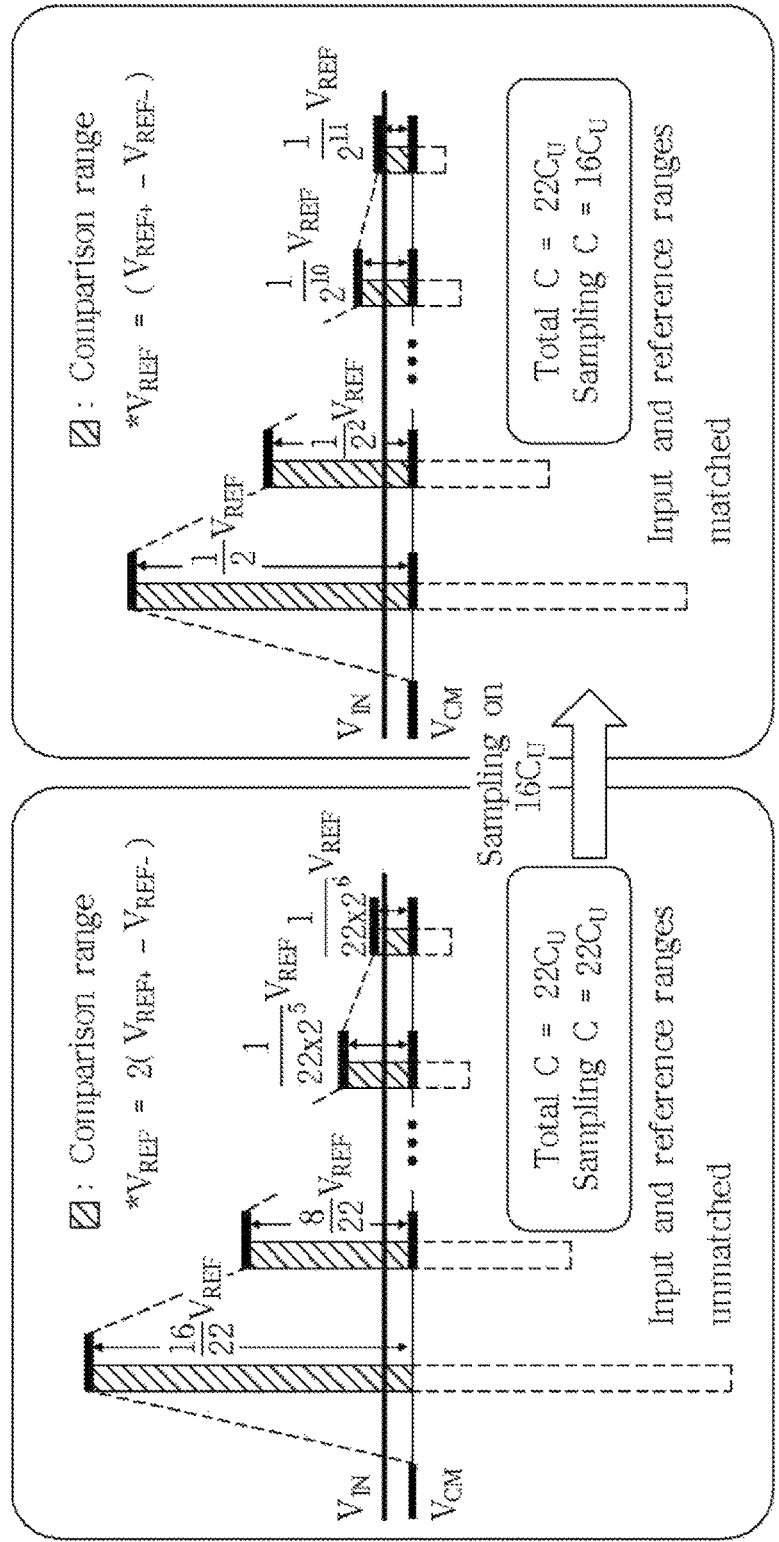
FIG. 8 is a diagram for describing steps of the input signal range scaling method of the SAR ADC of FIG. 1.

FIG. 8 is a diagram for describing steps of the input signal range scaling method of the SAR ADC of FIG. 1.

Referring to FIG. 8, when the input signal range scaling method is not applied, a comparison range between the input signal and the reference voltage at each phase during an SAR operation, ranges from $16V_{REF}/22$ to $V_{REF}/(22 \times 2^6)$, such that the ratio of comparison ranges between the input signal and the reference voltage does not correspond to powers of 2. However, when the input signal range scaling method is applied, the comparison range of the input signal and the reference voltage at each phase during an SAR operation ranges from $V_{REF}/2$ to $V_{REF}/2^{11}$, such that the ratio of the comparison ranges between the input signal and the reference voltage correspond to powers of 2. The input signal range scaling method can match the input signal with the range of the reference voltage, such the SAR operation can be normally performed.

Figure 9:
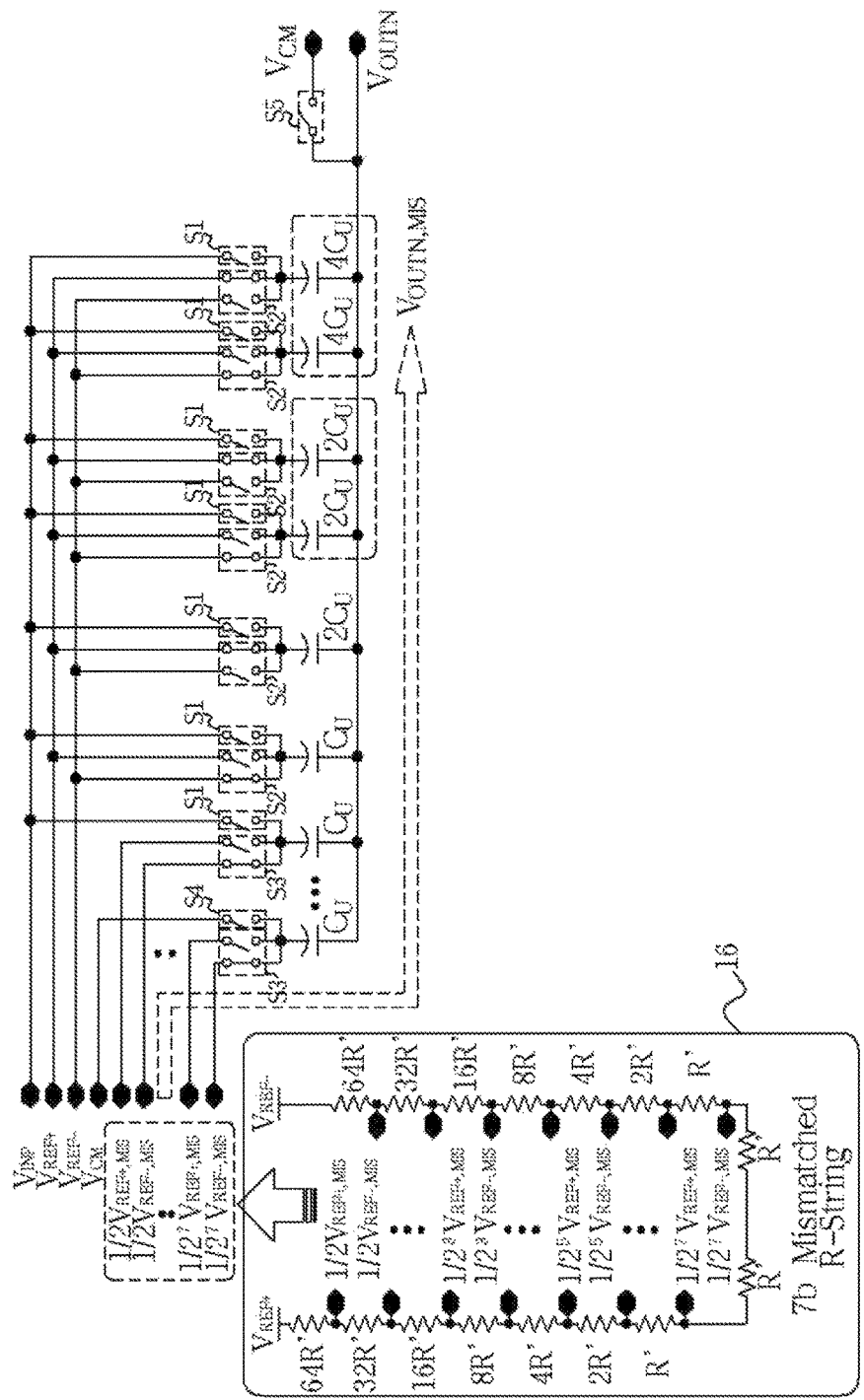
FIG. 9 is a diagram for describing a resistor string and a capacitor of the SAR ADC of FIG. 1.

FIG. 9 is a diagram for describing the resistor string and the capacitor structure of the SAR ADC of FIG. 1.

Referring to FIG. 9, the SAR ADC uses the capacitor-resistor hybrid structure to minimize the area of the DAC 10, and the applied resistor string 16 generates 14 differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ for determining the seven low-order bits. The 14 differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ may be distorted into abnormal reference voltages by a mismatch between the resistors. In this case, the entire performance of the SAR ADC may be degraded. The abnormal reference voltages distorted by the mismatch between the resistors may be expressed as Equation 2 below. Moreover, the 14 differential reference voltages $\frac{1}{2}V_{REF+}$, $\frac{1}{2}V_{REF-}$, $\frac{1}{2}^2V_{REF+}$, $\frac{1}{2}^2V_{REF-}$, ..., $\frac{1}{2}^7V_{REF+}$ and $\frac{1}{2}^7V_{REF-}$ generated by the resistor string 16, a non-linear error caused by the mismatch between the resistors, and the abnormal reference voltages are represented by $V_{REF+,-}/2^m$, $V_{ERROR}$ and $V_{REF,MIS}/2^m$, where m is an integer between 1 and 7.

$$\frac{1}{2^m} V_{REF,MIS} = \frac{1}{2^m}(V_{REF+MIS} - V_{REF-MIS})$$ [Equation 2]

$$= \frac{1}{2^m}(V_{REF+} - V_{REF-}) + V_{ERROR}$$

The abnormal reference voltages $V_{REF,MIS}/2^m$ obtained from Equation 2 appear as a value $V_{OUTN,MIS}$ at the output terminal as illustrated in FIG. 9. The value $V_{OUTN,MIS}$ indicates a value attenuated by the ratio of unit capacitors corresponding to the least significant bits in the capacitor array of the DAC 10. This value $V_{OUTN,MIS}$ needs to fall within ½ LSB of the 12-bit resolution, in order to have no influence on the ADC performance. The output voltage $V_{OUTN,MIS}$ of the DAC 10 appears as values attenuated from the abnormal reference voltages $V_{REF,MIS}/2^m$ by the ratio of the entire capacitor size $22C_U$. Thus, the non-linear error $V_{ERROR}$ is also attenuated at the same ratio. Therefore, the DAC 10 requires a matching accuracy of only 8 bits or more, such that the output voltage $V_{OUTN,MIS}$ has no influence on the performance of the ADC.

Figure 10:
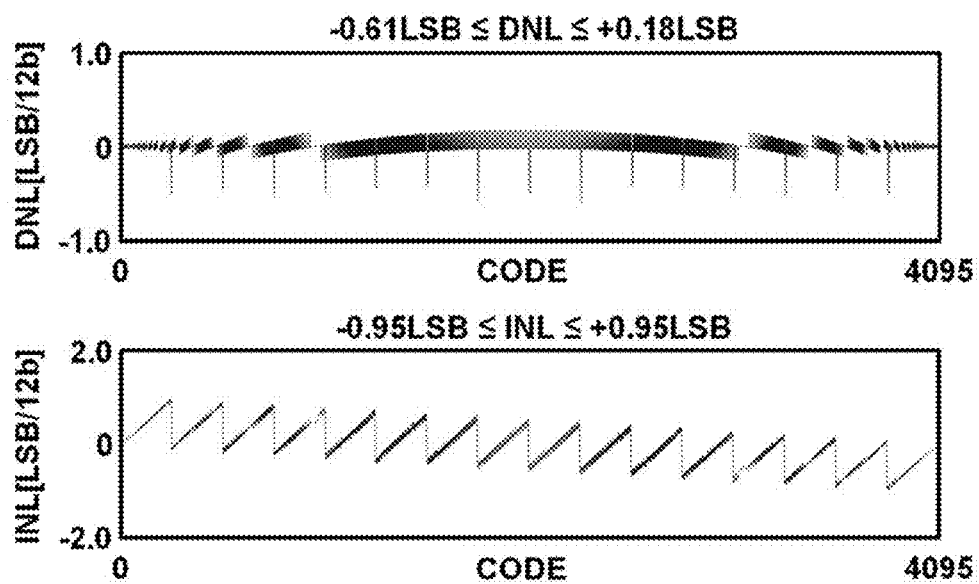
FIGS. 10 and 11 are simulation results illustrating static and dynamic performances of the SAR ADC of FIG. 1.
Figure 11:
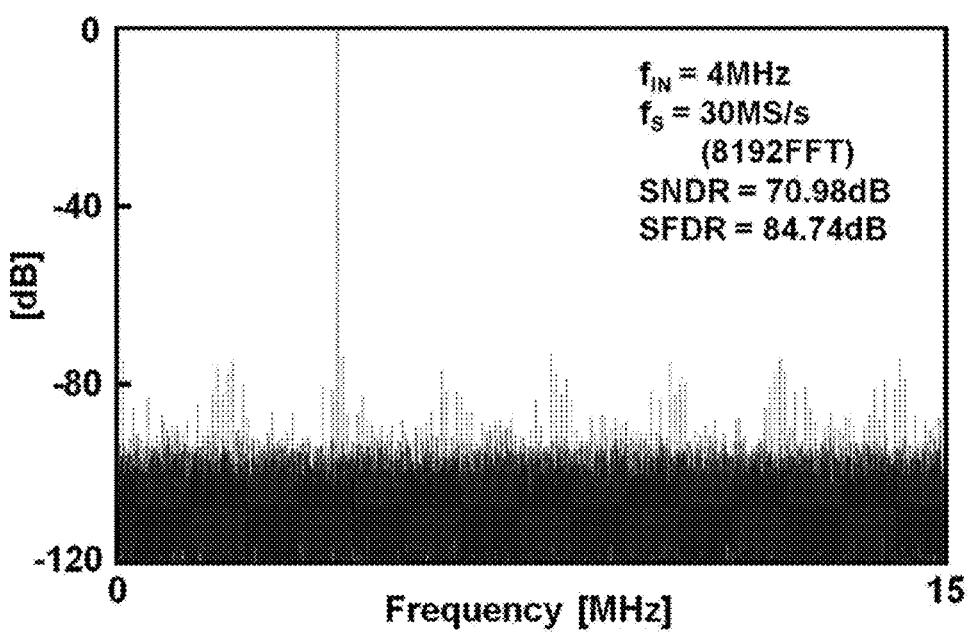

FIGS. 10 and 11 show results of simulations illustrating static and dynamic performances of the SAR ADC of FIG. 1.

In order to estimate the static and dynamic performances of the SAR ADC under the supposition that the matching accuracy between the unit resistors constituting the resistor string 16 can be secured up to 8 bits in a typical process, the simulations through MATLAB modeling were performed as illustrated in FIGS. 10 and 11.

The simulation results show that differential non-linearity (DNL) ranges from −0.61 LSB to 0.95 LSB as shown in FIG. 10. FIG. 11 shows a typical signal spectrum of the ADC, which was simulated at an input frequency of 4 MHz and an operating speed of 30 MS/s, and the maximum values of a signal-to-noise-and-distortion ratio (SNDR) and a spurious-free dynamic range (SFDR) indicating the dynamic performance are 70.98 dB and 84.74 dB, respectively.

A parasitic resistance between unit resistors may also distort the differential reference voltages generated by the resistor string 16, thereby degrading the linearity of the ADC. Therefore, a detailed layout is required, which considers the parasitic resistance as well as the matching accuracy between the unit resistors. Thus, the resistor string 16 applied to the DAC 10 may be implemented in such a manner that the unit resistors are coupled in series to each other, in order to make uniform the magnitudes of parasitic resistances between the respective unit resistors. Then, the reduction in performance of the ADC by the parasitic resistance can be minimized.

Figure 12:
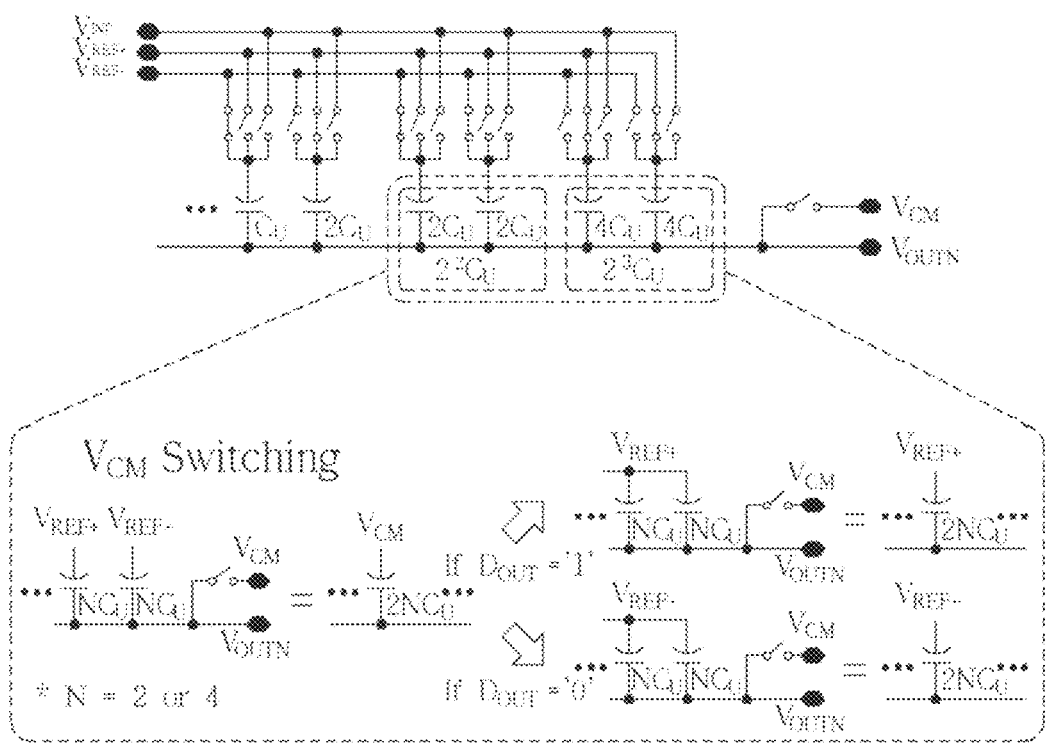
FIG. 12 is a diagram for describing the structure of an equally divided capacitor set of the SAR ADC of FIG. 1.

FIG. 12 is a diagram for describing the structure of the equally divided capacitor set of the SAR ADC of FIG. 1.

The SAR ADC determines the digital code of the two most significant bits through the common mode voltage-based switching method. In general, an additional switch and digital logic circuit may be required to apply the first and second reference voltages $V_{REF+}$ and $V_{REF-}$ and the common mode voltage $V_{CM}$ to the bottom plates of the capacitors for determining the two most significant bits. In the present embodiment, however, the equally divided capacitor set structure may be applied to the DAC 10 in order to implement the common mode voltage-based switching without an additional switch and digital logic circuit.

In the DAC 10, the capacitors $2^2C_U$ and $2^3C_U$ for determining the digital code of the two most significant bits to which the common mode voltage-based switching method is applied may be implemented with equally divided capacitors. By selectively applying the first and second reference voltages $V_{REF+}$ and $V_{REF-}$ to the equally divided capacitors, it is possible to implement the common mode voltage-based switching method without an additional switch and digital circuit for applying the common mode voltage $V_{CM}$.

First, the first and second reference voltages $V_{REF+}$ and $V_{REF-}$ are applied to the bottom plates of the equally divided capacitors $4C_U$, $4C_U$, $2C_U$ and $2C_U$ of the equally divided capacitor sets $2^3C_U$ and $2^2C_U$, respectively, before a comparison operation of the comparator. This operation has the same effect as when the common mode voltage $V_{CM}$ is applied to the equally divided capacitor set. After the comparison operation of the comparator, the first or second reference voltages $V_{REF+}$ or $V_{REF-}$ are applied to the bottom plates of the equally divided capacitors $4C_U$, $4C_U$, $2C_U$ and $2C_U$ of the equally divided capacitor sets $2^3C_U$ and $2^2C_U$, respectively, depending on an output digital code.

This operation has the same effect as when the first or second reference voltage $V_{REF+}$ or $V_{REF-}$ is applied to the equally divided capacitor set.

As such, in the present embodiment, the first and second reference voltages $V_{REF+}$ and $V_{REF-}$ may be selectively applied to the equally divided capacitor sets $2^3C_U$ and $2^2C_U$ in order to perform the common mode voltage-based switching.

The SAR ADC can be fabricated through the 90 nm CMOS process, the maximum values of the measured differential non-linearity (DNL) and integral non-linearity (INL) are 1.47 LSB and 2.76 LSB, respectively, and the maximum dynamic performance at an operating speed of 30 MS/s has an SNDR of 50.16 dB and an SFDR of 60.80 dB.

The low-power composite switching based SAR ADC may prevent a dynamic offset caused by a common mode voltage variation, and minimize the average switching power consumption of the ADC. Furthermore, the SAR ADC can simplify the number of switches and the digital logic circuit for a SAR operation through a simple switching operation.

Furthermore, the SAR ADC can determine a digital code of low-order bits using the capacitor-resistor hybrid DAC including the resistor string and the array of the unit capacitors, thereby reducing the total number of required unit capacitors. Furthermore, the SAR ADC can match an input signal with the range of the reference voltages by applying the input signal range scaling method to the capacitor-resistor hybrid DAC.

Furthermore, the SAR ADC can apply the equally divided capacitor set structure to the capacitors used for determining the digital code of the most significant bits, thereby stably performing common mode voltage-based switching without an additional switch and digital logic circuit.

Although various embodiments have been described for illustrative purposes, it will be apparent to those skilled in the art that various changes and modifications may be made without departing from the spirit and scope of the invention as defined in the following claims.

What is claimed is:

1. A successive-approximation register (SAR) analog-to-digital converter (ADC) comprising:
    a digital-to-analog converter (DAC),
    wherein the DAC comprises:
    a first capacitor array comprising a plurality of first capacitors;
    a second capacitor array comprising a plurality of second capacitors; and
    a resistor string suitable for generating differential reference voltages,
    wherein the SAR ADC determines a digital code of high-order bits by selectively applying first and second reference voltages and an input signal to the first capacitors, and
    wherein the SAR ADC determines a digital code of low-order bits by selectively applying the differential reference voltages and a common mode voltage to the second capacitors,
    wherein when sampling the input signal, the SAR ADC applies the common mode voltage to top plates of the first and second capacitors, applies the input signal to bottom plates of the first capacitors, applies the common mode voltage to bottom plates of the capacitors corresponding to the least significant bits, and applies the input signal to bottom plates of capacitors corresponding to most significant bits among the second capacitors.

2. The SAR ADC of claim 1,
    wherein the resistor string generates the differential reference voltages including levels which have a ratio of powers of 2, in the range of the first and second reference voltages, and
    wherein the resistor string provides the differential reference voltages to capacitors corresponding to least significant bits among the second capacitors.

3. The SAR ADC of claim 1,
    wherein capacities of the first capacitors have a ratio of powers of 2,
    wherein each of the second capacitors is a unit capacitor, and
    wherein the first capacitors and a part of the second capacitors are configured to sample the input signal.

4. The SAR ADC of claim 1,
    wherein the first capacitor array comprises equally divided capacitor sets each including first and second equally divided capacitors having the same capacity, and
    wherein the first and second equally divided capacitors are used for determining a digital code of most significant bits.

5. The SAR ADC of claim 4, wherein the SAR ADC determines the digital code of the most significant bits by applying the first and second reference voltages to the first and second equally divided capacitors before an operation of a comparator, and by applying the first or second reference voltage to the first and second equally divided capacitors according to the comparison result after the operation of the comparator.

6. The SAR ADC of claim 5,
    wherein the SAR ADC determines the digital code of high-order bits by selectively applying the first or second reference voltage to the first capacitors according to the comparison result of the comparator, and
    wherein the SAR ADC determines the digital code of low-order bits by selectively applying the differential reference voltages to the second capacitors according to the comparison result of the comparator.

7. A successive-approximation register (SAR) analog-to-digital converter (ADC) comprising:
    a digital-to-analog converter (DAC) comprising a first capacitor array including a plurality of first capacitors, a second capacitor array including a plurality of second capacitors, and a resistor string suitable for providing differential reference voltages;
    a comparator suitable for comparing output signals of the DAC; and
    a SAR logic circuit suitable for converting an input signal into a digital code using the comparison result,
    wherein the SAR logic circuit determines a digital code of high-order bits by selectively applying first and second reference voltages and an input signal to the first capacitors, and
    wherein the SAR logic circuit determines a digital code of low-order bits by selectively applying the differential reference voltages and a common mode voltage to the second capacitors,
    wherein when the input signal is sampled, the SAR logic circuit applies the common mode voltage to top plates of the first and second capacitors, applies the input signal to bottom plates of the first capacitors, applies the common mode voltage to bottom plates of capacitors corresponding to least significant bits among the second capacitors, and applies the input signal to bottom plates of capacitors corresponding to most significant bits among the second capacitors.

8. The SAR ADC of claim 7,
wherein the resistor string comprises resistors coupled in series, and generates the differential reference voltages including levels which have a ratio of powers of 2, in the range of the first and second reference voltages,
wherein capacities of the first capacitors have a ratio of powers of 2, and
wherein each of the second capacitors is a unit capacitor.

9. The SAR ADC of claim 8, wherein the first capacitors and a part of the second capacitors are configured to sample the input signal.

10. The SAR ADC of claim 7,
wherein the first capacitor array comprises equally divided capacitor sets each including first and second equally divided capacitors having the same capacity, and
wherein the SAR logic circuit determines a digital code of most significant bits by applying the first and second reference voltages to the first and second equally divided capacitors before the operation of the comparator, and by applying the first or second reference voltage to the first and second equally divided capacitors according to the comparison result of the comparator after the operation of the comparator.

11. The SAR ADC of claim 7,
wherein the SAR logic circuit determines the digital code of high-order bits by selectively applying the first and second reference voltages to the first capacitors according to the comparison result of the comparator, and
wherein the SAR logic circuit determines the digital code of low-order bits by selectively applying the differential reference voltages to the second capacitors according to the comparison result of the comparator.

12. The SAR ADC of claim 7, further comprising a reference voltage generator for generating the first and second reference voltages.

13. A successive-approximation register (SAR) analog-to-digital converter (ADC) comprising:
a digital-to-analog converter (DAC),
wherein the DAC comprises:
a first capacitor array comprising first capacitors of which the capacities have a ratio of powers of 2;
a second capacitor array comprising a plurality of second capacitors each of which is a unit capacitor; and
a resistor string suitable for generating differential reference voltages including levels which have a ratio of powers of 2, in the range of first and second reference voltages,
wherein the first capacitors and a part of the second capacitors are configured to sample the input signal,
wherein when sampling the input signal, the SAR ADC applies the common mode voltage to top plates of the first and second capacitors, applies the input signal to bottom plates of the first capacitors, applies the common mode voltage to bottom plates of capacitors corresponding to least significant bits among the second capacitors, and applies the input signal to bottom plates of capacitors corresponding to most significant bits among the second capacitors.

14. The SAR ADC of claim 13,
wherein the first capacitor array comprises equally divided capacitor sets each including first and second equally divided capacitors having the same capacity, and
wherein the first and second equally divided capacitors are used for determining a digital code of the most significant bits.

15. The SAR ADC of claim 14, wherein after the input signal is sampled, the SAR ADC blocks the common mode voltage from being applied to the top plates of the first and second capacitors, and determines the digital code of the most significant bits by applying the first and second reference voltages to the bottom plates of the first and second equally divided capacitors and applying the first or second reference voltage to the first and second equally divided capacitors according to a comparison result of a comparator.

16. The SAR ADC of claim 13, wherein the SAR ADC determines the digital code of high-order bits by selectively applying the first and second reference voltages to the first capacitors, and determines the digital code of low-order bits by selectively applying the differential reference voltages to the second capacitors.

17. The SAR ADC of claim 13, further comprising:
a comparator suitable for comparing output signals of the DAC; and
a SAR logic circuit suitable for converting the input signal into the digital code using the comparison result of the comparator.

* * * * *